United States Patent [19]

Shepherd

[11] 4,143,306
[45] Mar. 6, 1979

[54] HORIZONTAL DEFLECTION CIRCUIT
[75] Inventor: John Shepherd, Nellingen, England
[73] Assignee: International Standard Electric Corporation, New York, N.Y.
[21] Appl. No.: 840,942
[22] Filed: Oct. 11, 1977
[51] Int. Cl.² .................................... H01J 29/70
[52] U.S. Cl. .................................... 315/408
[58] Field of Search .................. 315/408, 411
[56] References Cited
U.S. PATENT DOCUMENTS

| 3,898,524 | 8/1975 | Reh ......................... 315/408 |
| 4,000,441 | 12/1976 | Reh et al. ................. 315/411 |

Primary Examiner—Maynard R. Wilbur
Assistant Examiner—Richard E. Berger
Attorney, Agent, or Firm—John T. O'Halloran; Peter C. Van Der Sluys

[57] ABSTRACT

The application relates to a thyristor-controlled horizontal deflection circuit of a television receiver with mains isolation. Input inductor, communtating inductor, and isolation transformer are united in one component. In the transformer used for this component, the open-circuit inductance performs the function of the input inductor of a conventional thyristor horizontal deflection circuit, and the short-circuit inductance that of the commutating inductor.

8 Claims, 3 Drawing Figures

HORIZONTAL DEFLECTION CIRCUIT

The present invention relates to a horizontal deflection circuit for generating the deflection current in the deflection coil of a television picture tube wherein a first switch controls the horizontal sweep, and wherein a second switch in a so-called commutation circuit with a commutating inductor and a commutating capacitor opens the first switch and, in addition, controls the energy transfer from a dc voltage source to an input inductor.

German Auslegeschrift (DT-AS) No. 1,537,308 discloses a horizontal deflection circuit in which, for generating a periodic sawtooth current within the respective deflection coil of the picture tube, in a first branch circuit, the deflection coil is connected to a sufficiently large capacitor serving as a current source via a first controlled, bilaterally conductive switch which is formed by a controlled rectifier and a diode connected in inverse parallel. The control electrode of the rectifier is connected to a drive pulse source which renders the switch conductive during part of the sawtooth trace period. In that arrangement, the sawtooth retrace, i.e. the current reversal, also referred to as "commutation", is initiated by a second controlled switch.

The first controlled switch also forms part of a second branch circuit where it is connected in series with a second current source and a reactance capable of oscillating. When the first switch is closed, the reactance, consisting essentially of a coil and a capacitor, receives energy from the second current source during a fixed time interval. This energy which is taken from the second current source corresponds to the circuit losses caused during the previous deflection cycle.

As can be seen, such a circuit needs two different, separate inductive elements, it being known that inductive elements are expensive to manufacture and always have a certain volume determined by the electrical properties required.

The object of the invention is to reduce the amount of inductive elements required.

The invention is characterized in that the input inductor and the commutating inductor are combined in a unit designed as a transformer which is proportioned so that the open-circuit inductance of the transformer is essentially equal to the value of the input inductor, while the short-circuit inductance of the transformer is essentially equal to the value of the commutating inductor, and that the second switch is connected in series with the dc voltage source and a first winding of the transformer.

This solution has an added advantage in that, in mass production, both the open-circuit and the short-circuit inductance are reproducible with reliability.

According to another feature of the invention, the electrical isolation between the windings of the transformer is such that the transformer operates as an isolation transformer between the supply and the subcircuits connected to a second winding or to additional windings of the transformer. In this manner, the transformer additionally provides reliable mains isolation.

According to a further feature of the invention, the second switch is connected between ground and that terminal of the first winding of the transformer not connected to the supply potential. This simplifies the control of the switch.

According to a further feature of the invention, to regulate the energy supply, the second winding of the transformer is connected in series with the first switch, the commutating capacitor, and a third, bipolar switch controllable as a function of the value of a controlled variable developed in the deflection circuit.

The advantage gained by this measure lies in the fact that the control takes place on the side separated from the mains, so no separate isolation device is required for the gating of the third switch. Further details and advantages will be apparent from the following description of the accompanying drawings and from the claims. In the drawings, FIG. 1 is a basic circuit diagram of the arrangement disclosed in German Auslegeschrift (DT-AS) No. 1,537,308;

Connected in series with a dc voltage source UB is an input inductor Le and a bipolar, controlled switch S2. In the following, this switch will be referred to as the "second switch"; it is usually called the "commutating switch" to indicate its function.

In known circuits, the second switch S2 consists of a controlled rectifier and a diode connected in inverse parallel.

Figure 1:
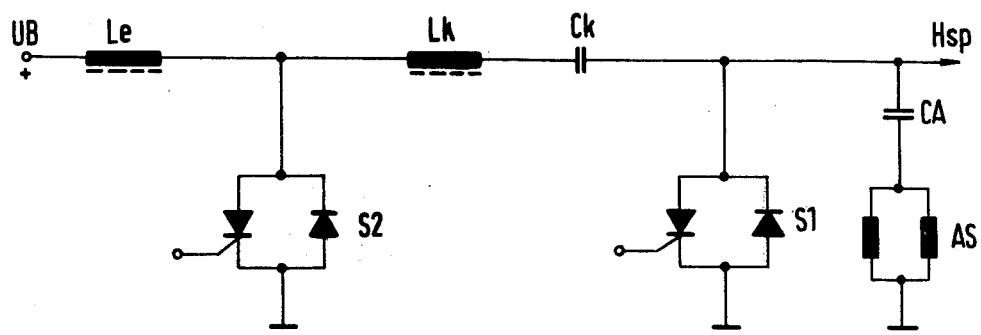
FIG. 1 shows the essential circuit elements of the horizontal deflection circuit known from the German Auslegeschrift (DT-AS) No. 1,537,308 referred to by way of introduction.
Figure 2:
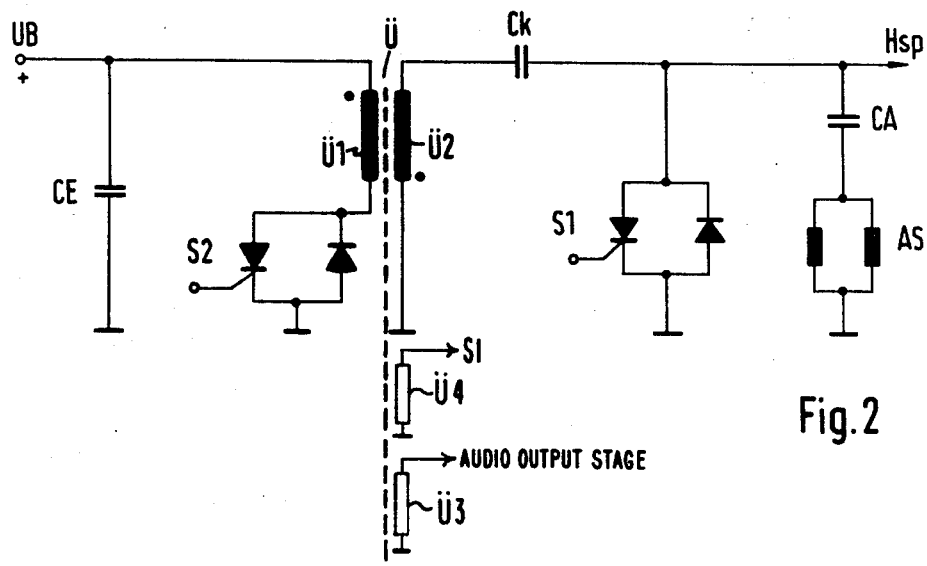
FIG. 2 shows a first embodiment of the horizontal deflection circuit according to the invention.
Figure 3:
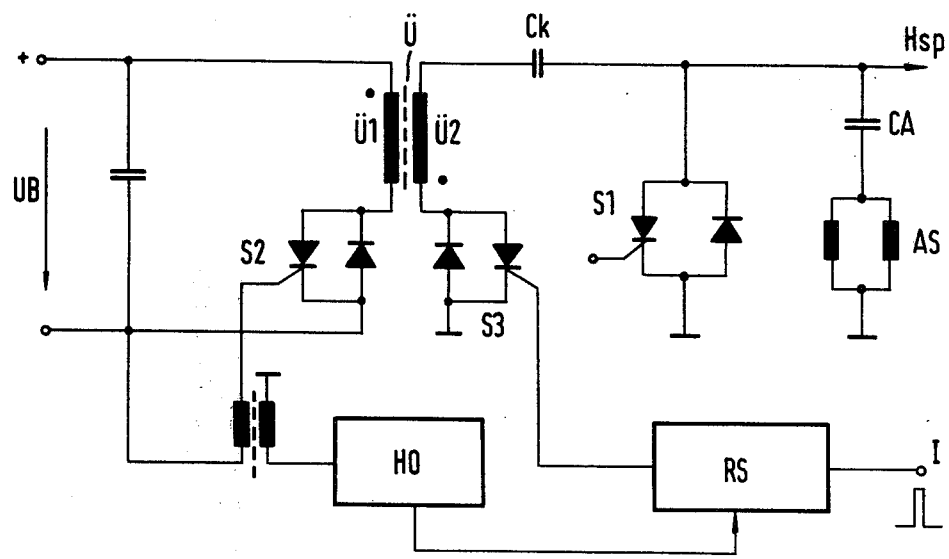
FIG. 3 shows a development of the horizontal deflection circuit according to the invention.

The second switch S2 also forms part of a second circuit which contains, in addition, a commutating inductor Lk, a commutating capacitor Ck, and a first switch S1. The first switch S1, controlling the horizontal sweep, is constructed in the same manner as the above-described second switch S2, consisting of a controlled rectifier and a diode in inverse parallel. Connected in parallel with this first switch is a deflection-coil arrangement AS with a capacitor CA as well as a high voltage generating arrangement (not shown). In FIGS. 1, 2, and 3, this arrangement is only indicated by an arrow and by the reference characters Hsp. The operation of this known horizontal deflection circuit need not be explained here in detail since it is described not only in the German Auslegeschrift referred to by way of introduction, but also in many other publications.

FIGS. 2 and 3 show the horizontal deflection circuit modified in accordance with the present invention. Like circuit elements are designated by the same reference characters as in FIG. 1.

FIG. 2 shows the basic principle of the invention. The two inductors Le and Lk of FIG. 1 have been replaced by a transformer Ü. To be able to serve as a substitute for the two inductors Le and Lk, the transformer must be proportioned in a special manner. Regardless of the turns ratio, the open-circuit inductance of the transformer is chosen to be essentially equal to the value of the input inductor Le, and the short-circuit inductance of the transformer is essentially equal to the value of the commutating inductor Lk.

To permit the second switch S2 to be utilized for the connection of the dc voltage source UB, it is included in the circuit of that winding U1 of the transformer connected to the dc voltage UB.

In principle, it is of no consequence for the operation of the switch S2 whether it is inserted on that side of the winding Ü1 connected to the positive operating potential +UB or on the side connected to ground. In practice, however, the solution shown in FIGS. 2 and 3 will be chosen since the gating of the controlled rectifier is less problematic in this case.

In compliance with pertinent safety regulations, the transformer Ü may be designed as an isolation transformer and can thus provide mains separation, which is necessary for various reasons. It is known from German Offenlegungschrift (DT-OS) No. 2,233,249 to provide dc isolation by designing the commutating inductor as a transformer, but this measure is not suited to attaining the object of the present invention.

If the energy to be taken from the dc voltage source is to be controlled as a function of the energy needed in the horizontal deflection circuit and in following subcircuits, the embodiment of the horizontal deflection circuit of FIG. 3 may be used.

The circuit including the winding Ü2 of the transformer Ü contains a third controlled switch S3, which, too, is inserted on the grounded side of the winding U2 for the reasons mentioned above. This third switch S3, just as the second switch S2, is operated at the frequency of a horizontal oscillator HO, but a control circuit RS whose input 1 is fed with a controlled variable is inserted between the oscillator and the switch S3. Depending on this controlled variable, the controlled rectifier of the third switch S3 can be caused to turn on earlier. A suitable controlled variable containing information on the energy consumption is, for example, the flyback pulse capable of being taken from the high voltage generating circuit (not shown). Details of the operation of this kind of energy control are described in applicant's German Offenlegungsschrift (DT-OS) No. 2,253,386 and do not form part of the present invention.

With mains isolation, the additional, third switch S3 shown here has the advantage of being on the side isolated from the mains and eliminates the need for an isolation device in the control lead of the controlled rectifier.

As an isolation transformer, the transformer Ü may also carry additional windings U3 and U4 if power is to be supplied to the audio output stage, for example; in addition, the first switch S1 may be gated via such an additional winding.

The points marked at the windings Ü1 and Ü2 indicate the phase relationship between the respective voltages. Connected in parallel with the winding U1 and the second switch S2 is a capacitor CE which completes the circuit for the horizontal-frequency alternating current; this serves in particular to bypass the dc voltage source or the electrolytic capacitors contained therein.

If required, a well-known tuning coil may be inserted, e.g. in series with the second winding Ü2, without changing the basic operation of the horizontal deflection circuit according to the invention.

What is claimed is:

1. A horizontal deflection circuit for generating the deflection current in the deflection coil of a television picture tube wherein a first switch controls the horizontal sweep, and wherein a second switch in a so-called commutation circuit with a commutating inductor and a commutating capacitor opens the first switch and, in addition, controls the energy transfer from a dc voltage source to an input inductor, characterized in that the input inductor (Le) and the commutating inductor (Lk) are combined in a unit designed as a transformer (Ü) which is proportioned so that the open-circuit inductance of the transformer is essentially equal to the value of the input inductor (Le), while the short-circuit inductance of the transformer (Ü) is essentially equal to the value of the commutating inductor (Lk), and that the second switch (S2) is connected in series with the dc voltage source (UB) and a first winding (Ü1) of the transformer (Ü).

2. A horizontal deflection circuit according to claim 1, characterized in that the transformer (Ü) operates as an isolation transformer between the supply (UB) and the subcircuits connected to a second winding.

3. A horizontal deflection circuit according to claim 1, characterized in that the second switch (S2) is connected between ground and that terminal of the first winding (Ü1) of the transformer (Ü) not connected to the supply potential (+UB).

4. A horizontal deflection circuit according to claim 1, characterized in that a capacitor (CE) is connected across the series combination of the first winding (Ü1) of the transformer and the second switch (S2).

5. A horizontal deflection circuit according to claim 1, characterized in that the second winding (Ü2) of the transformer (Ü) is connected in series with a first switch (S1), the commutating capacitor (Ck), and a third, bipolar switch (S3) controllable as a function of the value of a controlled variable developed in the deflection circuit.

6. A horizontal deflection circuit according to claim 5, characterized in that the third switch (S3) is connected between ground and the second winding (Ü2) of the transformer.

7. A horizontal deflection circuit according to claim 2, characterized in that the isolation transformer carries a third winding via which power is supplied to the audio output stage of the television set.

8. A horizontal deflection circuit according to claims 2, characterized in that the voltage serving to control the first switch (S1) is derived from a third winding of the transformer.

* * * * *